United States Patent
Wang et al.

(10) Patent No.: US 7,087,458 B2
(45) Date of Patent: Aug. 8, 2006

(54) METHOD FOR FABRICATING A FLIP CHIP PACKAGE WITH PILLAR BUMP AND NO FLOW UNDERFILL

(75) Inventors: Tie Wang, Singapore (SG); Ping Miao, Singapore (SG); Chun Sing Colin Lum, Singapore (SG); Yixin Chew, Singapore (SG)

(73) Assignee: AdvanPack Solutions Pte. Ltd., Singapore (SG)

( * ) Notice: Subject to any disclaimer, the term of this patent is extended or adjusted under 35 U.S.C. 154(b) by 93 days.

(21) Appl. No.: 10/283,436

(22) Filed: Oct. 30, 2002

(65) Prior Publication Data

US 2004/0087057 A1 May 6, 2004

(51) Int. Cl.
*H01L 21/44* (2006.01)

(52) U.S. Cl. .................. 438/108; 438/107; 438/118

(58) Field of Classification Search ............... 438/108, 438/107, 118, 117, 119, 110, 611, 612–617, 438/127, 112, 126, 116, 106, 128, 772–780, 438/125, 124, 123, 122, 111, 109, 113, 756–80; 174/52.2; 257/782, 678, 690
See application file for complete search history.

(56) References Cited

U.S. PATENT DOCUMENTS

| | | | | |
|---|---|---|---|---|
| 5,436,203 A | * | 7/1995 | Lin ............................ | 29/841 |
| 5,587,337 A | | 12/1996 | Idaka et al. ................ | 437/183 |
| 5,641,996 A | * | 6/1997 | Omoya et al. ............. | 257/787 |
| 6,083,773 A | | 7/2000 | Lake .......................... | 438/108 |
| 6,114,187 A | | 9/2000 | Hayes ........................ | 438/106 |
| 6,131,795 A | | 10/2000 | Sato ........................... | 228/102 |
| 6,180,696 B1 | * | 1/2001 | Wong et al. ................ | 523/457 |
| 6,184,062 B1 | | 2/2001 | Brofman et al. ........... | 438/106 |
| 6,392,163 B1 | | 5/2002 | Rinne et al. ............... | 174/261 |
| 6,451,673 B1 | * | 9/2002 | Okada et al. .............. | 438/513 |
| 6,492,203 B1 | * | 12/2002 | Wakashima et al. ....... | 438/127 |
| 6,599,775 B1 | * | 7/2003 | Tie et al. ................... | 438/108 |
| 6,673,653 B1 | * | 1/2004 | Pierce ........................ | 438/118 |
| 6,677,522 B1 | * | 1/2004 | Carey et al. ............... | 174/52.2 |
| 6,800,169 B1 | * | 10/2004 | Liu et al. ................... | 156/292 |
| 6,884,313 B1 | * | 4/2005 | Liu et al. ................... | 156/292 |
| 2002/0129894 A1 | * | 9/2002 | Liu et al. ................... | 156/291 |
| 2003/0019568 A1 | * | 1/2003 | Liu et al. ................... | 156/245 |
| 2004/0087057 A1 | * | 5/2004 | Wang et al. ............... | 438/106 |
| 2004/0110366 A1 | * | 6/2004 | MacKay et al. ........... | 438/613 |

FOREIGN PATENT DOCUMENTS

JP 2001339006 A * 12/2001

* cited by examiner

*Primary Examiner*—Laura Schillinger
(74) *Attorney, Agent, or Firm*—Saile Ackerman LLC; Stephen B. Ackerman; Douglas R. Schnabel

(57) ABSTRACT

A method for joining a semiconductor integrated circuit (IC) chip in a flip chip configuration, via pillar bump, to solderable metal contact pads, leads or circuit lines on the ciruitized surface of a chip carrier, as well as the resulting chip package, are disclosed. The semiconductor device is attached to the substrate via no flow underfill under thermal compression bonding. Integration of this structure and assembly method enables to incorporate low coefficient of thermal expansion (CTE) no flow underfill and achieve high assembly yield, especially for lead free bumps. The present invention provides a solution for a flip chip package with fine pitch, high pin count and lead free requirements.

13 Claims, 3 Drawing Sheets

METHOD FOR FABRICATING A FLIP CHIP PACKAGE WITH PILLAR BUMP AND NO FLOW UNDERFILL

FIELD OF THE INVENTION

The present invention relates generally to semiconductor packaging and more specifically to fabrication of a flip chip configured microelectronic package interconnected via a combination of a no flow underfill and pillar bump.

BACKGROUND OF THE INVENTION

As current and future microelectronic packaging requirements trend towards miniaturization the demand for denser, lighter, smaller, thinner and faster electronic products continues. The present invention provides a method for fabricating a high density fine-pitch flip chip package structure using pillar bump interconnect technology incorporating low CTE no flow underfill as related to the manufacture of electronic components.

U.S. Pat. No. 6,392,163 to Rinne et al. describes a method for controlling height, shape and volume of solder bump interconnects.

U.S. Pat. No. 6,184,062 to Brofman et al. discloses a process for forming cone shaped solder for chip interconnection.

U.S. Pat. No. 6,131,795 to Sato shows a thermal compression bonding method of an electronic die with solder bump.

U.S. Pat. No. 6,114,187 to Hayes describes a method of preparing column of solder bumps for chip scale package.

U.S. Pat. No. 6,083,773 to Lake discloses a method for forming flip chip bumps and related flip chip bump constructions.

U.S. Pat. No. 5,587,337 to Idaka et al. shows a semiconductor process for forming bump electrodes with tapered sidewalls.

SUMMARY OF THE INVENTION

It is therefore an object of the present invention to provide a structure and method for the fabrication of a fine-pitch flip chip package.

It is another object of the invention to provide a means for realizing a high assembly yield for lead free bumped flip chip package.

In yet another objective of the present invention is to incorporate low CTE no flow underfill layer into the flip chip package to deliver better reliability.

In order to accomplish these and other objectives of the invention, a method is provided for joining a semiconductor IC chip in a flip chip configuration via a combination of no flow underfill and pillar bump to solderable metal contact pads, leads, or circuit lines on the personalized surface of a chip carrier substrate as well as the resulting chip package In accordance with the present invention the substrate may comprise any of the following: ceramic material, rigid or flexible polymeric laminate. The substrate is personalized with conductive electrodes/terminals and a silica filled low CTE no flow underfill layer is deposited on the substrate. Next the semiconductor device is positioned with inteconnecting solder bumps aligned with terminal pads, after which the IC chip and substrate are brought together under thermal compression bonding.

BRIEF DESCRIPTION OF THE DRAWINGS

The foregoing and other objects, aspects and advantages of the present invention will be more clearly understood from the following detailed description taken in conjunction with the accompanying drawings. The drawing illustrate like reference numerals designating similar or corresponding elements, regions and portions and in which.

DETAILED DESCRIPTION OF THE PREFERRED EMBODIMENT

Problems Discovered by the Inventors

The inventors have discovered the following problems and disadvantages with the current practice:

1. For flip chip packaging structures thermomechanical stress buildup at the interconnect joint resulting from CTE mismatch between chip and substrate.

2. Flip chip structures utilizing spherical reflowable solder bumps and capillary underfill have been limited in meeting fine pitch wiring requirements. In order to overcome current fine pitch wiring limitations solder bump size reduction must be introduced which than results in reduced stand-off causing underfill difficulty.

3. Fine pitch wiring requirements have introduced process complexity, reduced yields to the capillary underfill process.

4. Loading percentage of Silica filler into no flow underfill is extremely limited due to trapped silica between solder bumps and I/O pads.

5. Lead free solder as flip chip bumping material has a higher melting point compared to their tin lead counterpart. It is thus imperative that no flow underfill have stronger fluxing properties even at higher temperatures, for instance 220° C.–230° C. Unfortunately, properties that are required for a good flux are not totally compatible with that required for good underfill. It has been observed that serious voids are generated during lead free solder reflow process through reflow oven, which probably resulted from reaction between molten solder and certain components inside the underfill material. Thus, the properties that are required for a good flux is not totally compatible with that required with a good underfill.

6. The process as practiced in the current art using non-filled high CTE no flow underfill lends to exposure to reduced yields, and short/long term reliability performance issues in large die, high density applications.

Initial Structure

Figure 1A:
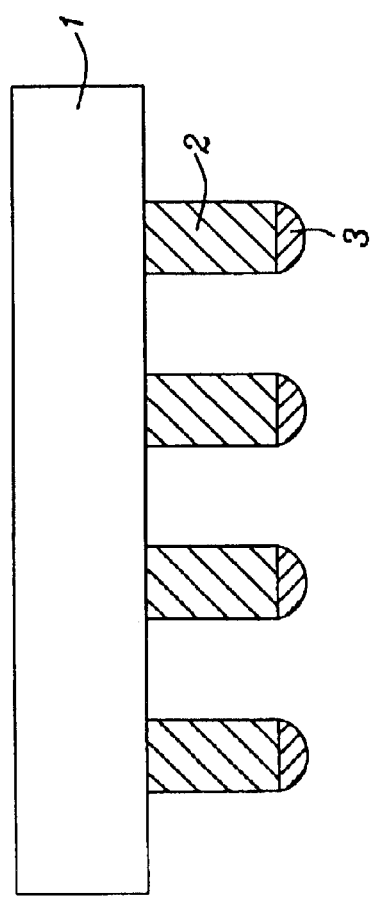
FIG. 1a is a cross-sectional representation of the invention, showing a semiconductor device (IC) having a pillar bump structure with a free-end solder portion.

Referring to the drawings, and more particularly to FIG. 1a, there is shown a cross-sectional view of semiconductor IC 1 with pillar bumps provided. Structure 1 is preferably a semiconductor structure and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Pillar bump cross-sectional structure comprises a base portion 2 and a free-end portion 3. The base portion 2 may comprise any non-reflowable material, but is preferably comprised of copper. The free end portion 3 is composed of a reflowable material, and is preferably deposited tin-lead eutectic solder, or lead-free solder. Formation of the pillar bump structure is described in U.S. patent application Publication 2002/0033412A1, herein incorporated by reference.

Figure 1B:
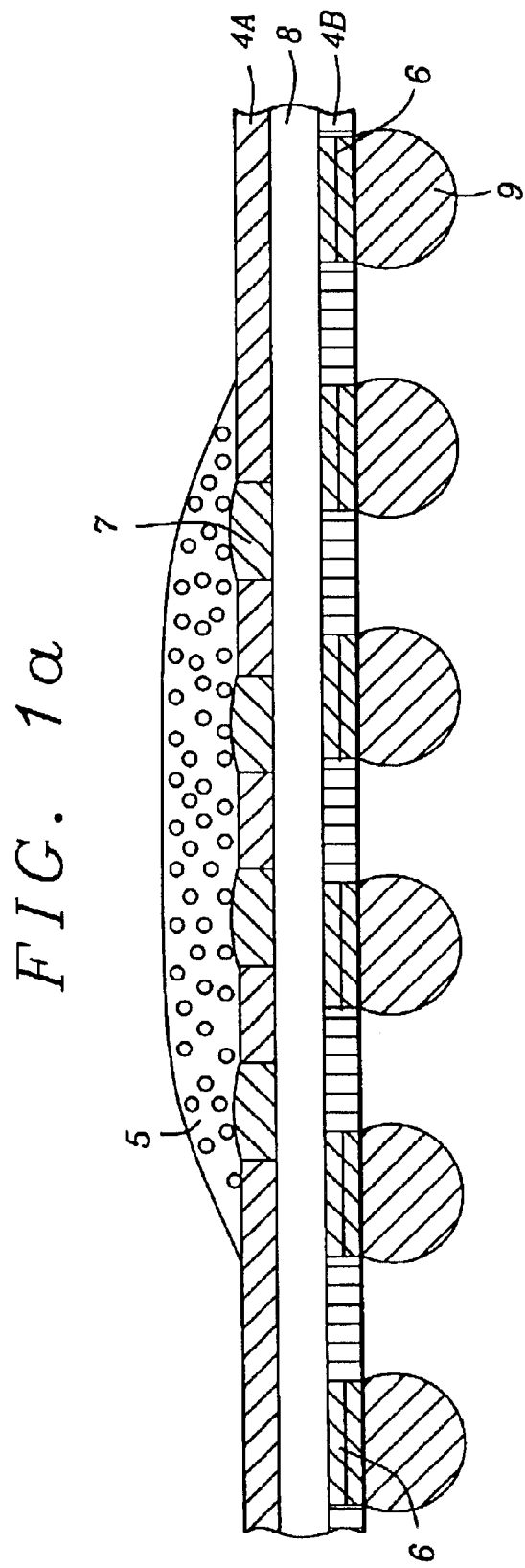
FIG. 1b is a cross-sectional representation of the invention, showing a substrate having an insulating base layer, patterned layers of conductors, layers of solder mask and underfill layer.

FIG. 1b is a cross-sectional representation of a substrate having a non-conductive base layer 8 which can be composed of a ceramic material (e.g., alumina) or an organic rigid or flexible laminate dielectric material, such as, polyimide or benzocyclobutene. Furthermore FIG. 1b illustrates patterned layers of conductor 6 preferably comprised of copper pads on which are deposited C-4 BGA solder balls 9, formed in openings in solder mask passivation layer 4b.

Silica filled low CTE no flow underfill layer 5 is deposited on the substrate.

Bonding or terminal pad 7 is preferably comprised of copper and is designed to protrude above solder mask 4a, to facilitate contact with bump during bonding. Semiconductor IC 1 is positioned with bumps aligned with bonding or terminal pad 7 so that IC and substrate are brought together under thermal compression bonding.

Figure 2A:
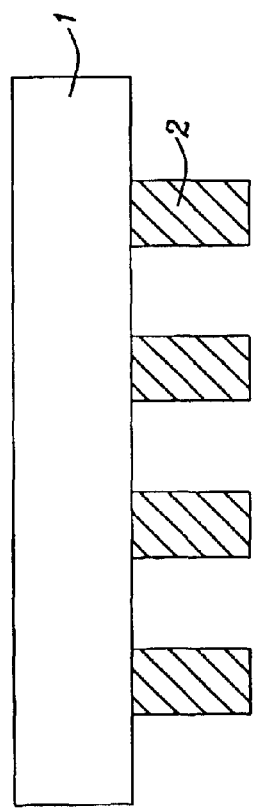
FIG. 2a is a cross-sectional representation of the invention showing a semiconductor device (IC) having a pillar bump structure only.

FIG. 2a is an alternative structure for the current invention, whereby the pillar bump structure comprises portion 2 only, preferably non-reflowable copper.

Figure 2B:
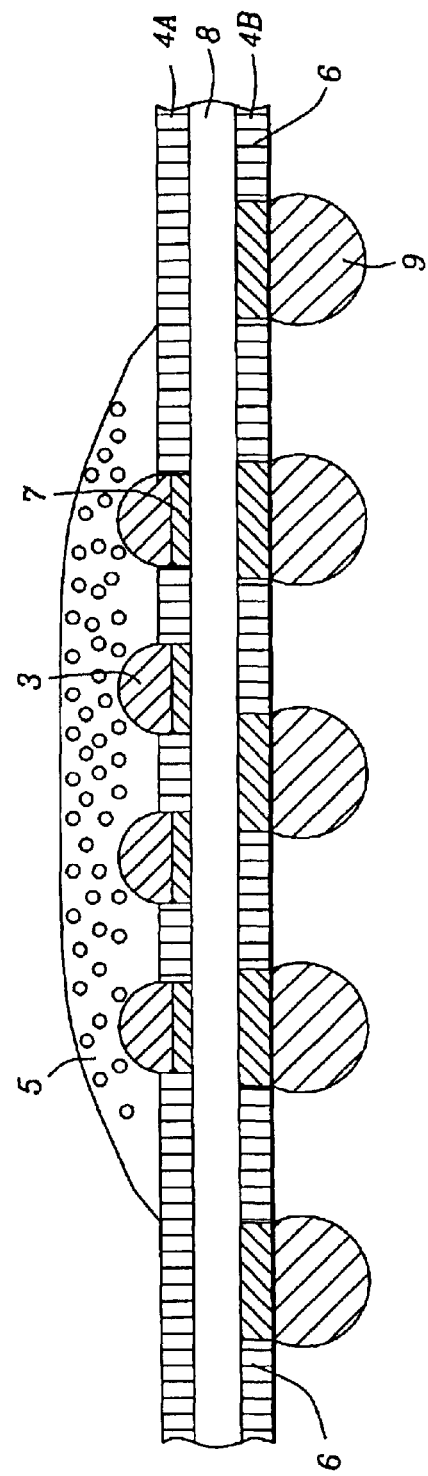
FIG. 2b is a cross-sectional representation of the invention illustrating a substrate having an insulating base layer, patterned layers of conductors capped with a free-end solder portion, layers of solder mask and underfill layer.

FIG. 2b is a cross-sectional view illustrating reflowable solder material 3 which is applied to electrode 7 during substrate manufacturing. Deposition process is applied by printing/electrolytic plating, but is preferably via electrolytic plating in fine-pitch application.

Key Steps of the Invention

Figure 3:
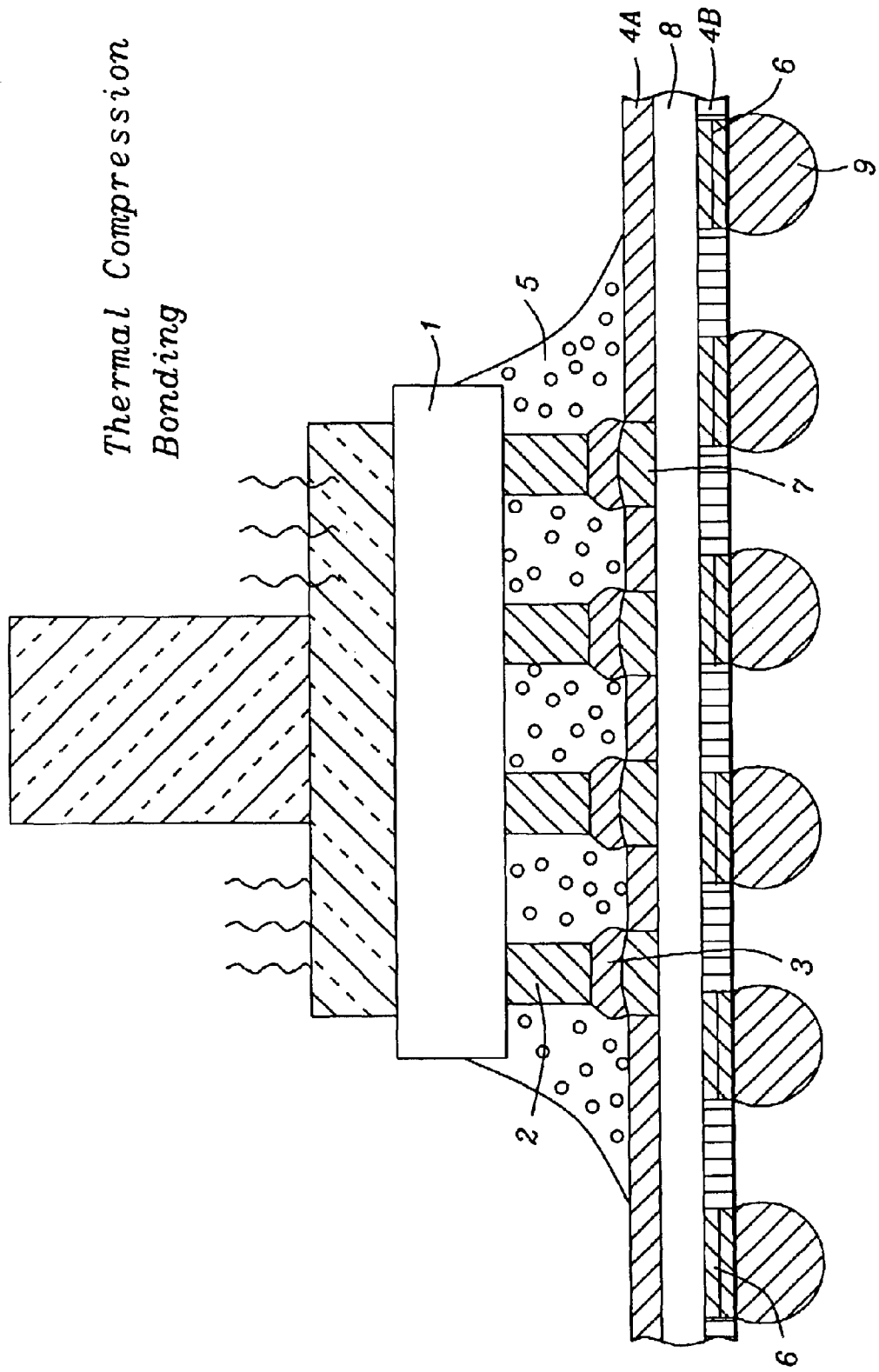
FIG. 3 is a cross-sectional representation of a preferred embodiment of the present invention formed under thermal compression bonding.

FIG. 3 is a cross-sectional view of the preferred structure of the invention. In a key feature of the invention FIG. 3 illustrates a flip chip package formed with pillar bump and no flow underfill in accordance with the present invention. It further shows that at an elevated reflow temperature range under force, the free-end solder portion 3 melts and pushes away silica filler to form an interconnect between IC chip and substrate.

The process of the invention may be understood with respect to FIGS. 1, 2 and 3. The structure of FIG. 1a is joined with the structure of FIG. 1b by thermal compression bonding by applying temperature, pressure and time. FIG. 1b is comprised of a ceramic or an organic nonconductive substrate on which patterned layers of Cu are formed where underlying Cr or Ti adhesion layers may be used. Ni/Au coating or osp (organic solder preservative) protection are normally applied. Silica filled low CTE no flow underfill is deposited on the substrate by, for example, a standard dispensing or printing technique. The semiconductor device/IC is positioned such that the pillar bumps as shown in FIG. 1a are aligned with the terminal conductor pads of FIG. 1b after which the IC and substrate are brought together under thermal compression bonding at a controlled temperature pressure and time. The terminal conductive pads are designed to be above the solder mask to facilitate contact with pillar bumps during bonding. At an elevated reflow temperature range under pressure, the free-end solder portion 3 of the pillar bump melts and pushes away silica filler to form an interconnect between IC chip and substrate. Similarly as shown in FIGS. 2a & 2b, the semiconductor device/IC is positioned such that the pillar structure as shown in FIG. 2a is aligned with the solder capped bumps of terminal conductor pads of FIG. 2b after which the IC and substrate are brought together under thermal compression bonding at a controlled temperature pressure and time. The solder capped terminal conductive pads are designed to be above the solder mask to facilitate contact with the pillars of FIG. 2a during bonding. At an elevated reflow temperature range under pressure, the free-end solder portion 3 of the substrate melts and pushes away silica filler to wet the pillar to form an interconnect between IC chip and substrate. A flip chip package formed with pillar bump or solder capped substrate electrodes and no flow underfill in accordance with the present invention is shown by FIG. 3.

The advantages of the invention are described below.

Advantages of the Present Invention

The advantages of the present invention include:

1. Allows for the incorporation of a low coefficient of thermal expansion (CTE) no flow underfill with increased reliability.
2. Provides for achievement of high assembly yield especially for lead free bumps.
3. Formation of a robust flip chip structure/package meeting fine pitch, high pin count and lead free requirements.

While the present invention has been described and illustrated with respect to preferred embodiments, it is not intended to limit the invention, except as defined by the following claims. Furthermore, numerous modifications, changes, and improvements will occur to those skilled in the art without departing from the spirit and scope of the invention.

We claim:

1. A method for forming a flip-chip package structure comprising:
   providing a semiconductor device, having formed thereover one or more pillars and patterned layers of conductors each top coated with lead or lead free solder bumps wherein said pillars are formed by a method comprising:
      depositing a seed layer over said semiconductor device;
      forming a bottom metallization layer over said seed layer;
      forming a top metallization layer over said bottom metallization layer; and
      patterning said top and bottom metallization layers, using a bump-sized mask;
   providing a substrate having a plurality of bond pads;
   thereafter depositing a no flow underfill encapsulant over said bond pads exposed through bump-based size solder masks on said substrate wherein said no flow underfill encapsulated further comprises silica, aluminum oxide, aluminum nitride, or born nitride filler; and
   thereafter attaching said semiconductor device to said substrate by thermal compression bonding.

2. The method of claim 1 wherein each of said pillar bumps are aligned with the exposed said bond pads in said substrate during said attaching.

3. The method of claim 1 wherein said thermal compression bonding comprises applying a down force of between about 5 and 100 newtons at a temperature of between about 180° C. and 350° C. to melt the bonding material.

4. The method of claim 1 wherein said bond pads comprise Cu or Ni/Au or osp coating or solder cap.

5. The method of claim 4 wherein said substrate is a multilayer laminate, a flexible printed circuit board, or is a ceramic.

6. The method of claim 1 wherein said top and bottom metallization layers are selected from the group comprising Ti/NiV/CU or Cr/CrCu/Cu.

7. The method claim 1 wherein pillar bumps are comprised of Cu (copper).

8. The method of claim 1 wherein pillar bumps are capped with lead or lead free alloys of solder material selected from the group comprising SnAg, PbSn, PbSnAg, Sn/Cu, SnAgCu, and SnBi.

9. The method of claim 1 wherein said no flow underfill encapsulant comprises a no flow material with inorganic particles dispersed therein.

10. The method of claim 1 wherein said substrate is selected from the group consisting of $Si_3N_4$, $SiO_2$, $Si_3N_4/SiO_2$.

11. The method of claim 1 wherein said substrate is selected from the group consisting of an organic low dielectric laminate comprising polyimide and benzocyclobutene.

12. The method of claim 1 wherein said metallization layers are comprised of material selected from the group consisting of copper and aluminum.

13. The method of claim 1 wherein the top and bottom metallization and seed layers are comprised of a material selected from the group consisting of Ti/Cu, Cr/Cu, Ti/Ni, and Ni/Au.

* * * * *